United States Patent
Ahmed

(10) Patent No.: US 9,983,967 B2
(45) Date of Patent: May 29, 2018

(54) INSTRUCTION PROVIDER AND METHOD FOR PROVIDING A SEQUENCE OF INSTRUCTIONS, TEST PROCESSOR AND METHOD FOR PROVIDING A DEVICE UNDER TEST

(71) Applicant: Advantest Corporation, Tokyo (JP)

(72) Inventor: Kazi Iftekhar Ahmed, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 0 days. days.

(21) Appl. No.: 15/166,725

(22) Filed: May 27, 2016

(65) Prior Publication Data

US 2016/0274988 A1   Sep. 22, 2016

Related U.S. Application Data

(63) Continuation of application No. PCT/EP2013/075281, filed on Dec. 2, 2013.

(51) Int. Cl.
*G06F 11/00* (2006.01)
*G06F 11/263* (2006.01)
(Continued)

(52) U.S. Cl.
CPC ........ *G06F 11/2635* (2013.01); *G06F 11/263* (2013.01); *G06F 11/2733* (2013.01); *H03M 7/3088* (2013.01); *H03M 7/46* (2013.01)

(58) Field of Classification Search
USPC ........................................................ 714/33
See application file for complete search history.

(56) References Cited

U.S. PATENT DOCUMENTS 6,327,545 B1   12/2001   Browen et al.
6,397,160 B1   5/2002   Craig et al.
(Continued)

FOREIGN PATENT DOCUMENTS

EP   0626588   11/1994
EP   1298778   4/2003
(Continued)

OTHER PUBLICATIONS

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.
(Continued)

*Primary Examiner* — Sarai E Butler

(57) ABSTRACT

An instruction provider for providing a sequence of instructions based on a representation of a sequence of test vectors. Each instruction defines the provision of at least one test vector to a device under test. The instruction provider is configured to identify in the representation of the sequence of test vectors subsequences of test vectors which occur at least two times in the representation of the sequence of test vectors. Furthermore, the instruction provider is configured to store the identified subsequences in a dictionary memory structure and to provide the sequence of instructions such that the sequence of instructions includes at least a first instruction defining a first provision of a first subsequence of test vectors stored in the dictionary memory structure and a second instruction defining a second provision of the first subsequence. The first instruction and the second instruction reference to the same entry of the dictionary memory structure.

15 Claims, 7 Drawing Sheets

(51) Int. Cl.
*H03M 7/30* (2006.01)
*H03M 7/46* (2006.01)
*G06F 11/273* (2006.01)

(56) References Cited

U.S. PATENT DOCUMENTS

| | | | |
|---|---|---|---|
| 6,795,496 B1 | 9/2004 | Soma et al. | |
| 6,941,494 B1* | 9/2005 | Andreev | G11C 29/26 714/25 |
| 7,003,697 B2* | 2/2006 | Magliocco | G01R 31/3183 714/25 |
| 7,089,473 B2* | 8/2006 | Mates | G01R 31/3177 714/39 |
| 7,256,585 B1 | 8/2007 | Shoulders | |
| 7,620,861 B2* | 11/2009 | Lai | G01R 31/318342 370/222 |
| 8,972,808 B2* | 3/2015 | Geukes | G01R 31/3177 714/25 |
| 9,031,997 B2* | 5/2015 | Chelliah | H03M 7/3088 707/802 |
| 2004/0004466 A1 | 1/2004 | Miyanaga et al. | |
| 2005/0050546 A1 | 3/2005 | Remany et al. | |
| 2005/0234662 A1 | 10/2005 | Niedzwiecki et al. | |
| 2009/0092177 A1 | 4/2009 | Dvorak et al. | |
| 2009/0129129 A1 | 5/2009 | Udagawa | |
| 2010/0225301 A1 | 9/2010 | Nakayama et al. | |
| 2010/0309952 A1 | 12/2010 | Asami | |
| 2010/0312506 A1 | 12/2010 | Taylor | |
| 2011/0227767 A1 | 9/2011 | O'Brien | |
| 2012/0049655 A1 | 3/2012 | Leyendecker et al. | |
| 2012/0221279 A1 | 8/2012 | Zhang | |
| 2013/0006567 A1 | 1/2013 | Horn | |

FOREIGN PATENT DOCUMENTS

| | | |
|---|---|---|
| JP | H111038087 | 2/1999 |
| JP | 2000009792 | 1/2000 |
| WO | 99/21025 | 4/1999 |
| WO | 2012/084028 | 6/2012 |

OTHER PUBLICATIONS

White, H.E., "Printed English Compression by Dictionary Encoding," Proceedings of the IEEE, vol. 55, No. 3, Mar. 1967, pp. 390-396.
Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.
Lenk, F., et al., "A New Multipart Measurement-Method Using a Two-Port Network Analyzer," IEEE MTT-S International Microwave Symposium, Jun. 12-17, 2005, pp. 1663-1666.
Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.
Chen, C.-J., et al., "An Error Analysis of the Scattering Matrix Renormalization Transform," IEEE Transactions on Microwave Theory and Techniques, vol. 57, No. 4, Apr. 2009, pp. 863-868.
Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.
Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.
Liu, Lei, "Finite Automata for Evaluating Testbed Resource Contention," IEEE, Wireless Telecommunications Symposium WTS 2007, Piscataway, NJ, Apr. 26, 2007, pp. 1-6.
Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.
Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.
Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

\* cited by examiner

| Idx | vector data (hex format) | |
|---|---|---|
| A→ 00 | 00 F1 F3 E1 05 90 55 AA | ～105 |
| B→ 01 | 80 F3 F1 E8 04 90 | ～107 |
| C→ 02 | 91 F1 F4 E1 05 D0 75 AD | ～109 |

Repeat 1 {DIC_ENTRY 0, length=8} // A
Repeat 2 {DIC_ENTRY 1, length=6} // B

|   | Idx | vector data (hex format) |
|---|---|---|
| A→ | 00 | 00 F1 F3 E1 05 90 55 AA BB CD DA 03 AC |
| B→ | 01 | 80 F3 F1 E8 04 90 55 AA |
| C→ | 02 | ~~E1 05 90 55~~ |

Repeat 1 {DIC_ENTRY 0, length=13} // A

• • •

Repeat 2 {DIC_ENTRY 0, offset=3, length=4} // C

FIGURE 4B

FIGURE 7A
FIGURE 7B
FIGURE 7C
FIGURE 7D

INSTRUCTION PROVIDER AND METHOD FOR PROVIDING A SEQUENCE OF INSTRUCTIONS, TEST PROCESSOR AND METHOD FOR PROVIDING A DEVICE UNDER TEST

CROSS-REFERENCE TO RELATED APPLICATIONS

This application is a continuation of copending International Application No. PCT/EP2013/075281, filed Dec. 2, 2013, which is incorporated herein by reference in its entirety.

Embodiments of the present invention relate to an instruction provider for providing a sequence of instructions and a corresponding method. Further embodiments of the present invention relate to a test processor for providing a device under test signal for a device under test and a corresponding method. Further embodiments of the present invention relate to a test system comprising such a test processor and a dictionary memory structure.

BACKGROUND OF THE INVENTION

In conventional test systems a run length encoding (RLE) algorithm is used to compress vector data of a pattern to reduce the tester (sequencer) memory footprint of the test pattern. The compression can be done by the software (or user) and the decompression can be done by a test processor sequencer program. Conventional RLE algorithms can only compress the data if there is a consecutive repeating pattern in the program. In some cases (such as pseudo random bit sequences—PRBS) the data has no consecutive repeating sequences. A test program can be huge in size (for example even larger than 200 MB) and sometimes cannot be even loaded into a tester memory. Furthermore, a further growth of such test programs is expected for the future.

FIGS. 7A-7D show an example how a conventional run length encoding algorithm is performed.

A sequence of data as shown in FIG. 7A having the length of 18 is assumed. For reasons of simplicity it is assumed that all blocks have the same length.

Using a conventional run length encoding algorithm this sequence in FIG. 7A can be compressed to the sequence shown in FIG. 7B having the length 9, and thereby achieving a compression factor of 2.

But when the data looks like shown in FIG. 7C, it can only be compressed to the sequence shown in FIG. 7D having a length of 16.

SUMMARY

An embodiment may have an instruction provider for providing a sequence of instructions based on a representation of a sequence of test vectors, each instruction defining the provision of at least one test vector to a device under test; wherein the instruction provider is configured to identify in the representation of the sequence of test vectors subsequences of test vectors which occur at least two times in the representation of the sequence of test vectors, to store the identified subsequences of test vectors in a dictionary memory structure and to provide the sequence of instructions such that the sequence of instructions includes at least a first instruction defining a first provision of a first subsequence of test vectors stored in the dictionary memory structure, and a second instruction defining a second provision of the first subsequence of test vectors; and when the first instruction and the second instruction reference to a same entry of the dictionary memory structure; wherein the instruction provider is configured to provide the sequence of instructions such that the sequence of instructions includes a third instruction defining the provision of a true subset of the first subsequence of test vectors; and wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors.

Another embodiment may have a test processor for providing a device under test signal for a device under test based on a sequence of instructions; wherein the test processor is configured to obtain an entry of a dictionary memory structure in response to a first instruction in the sequence of instructions, wherein the entry represents a subsequence of test vectors stored in the dictionary memory structure; wherein the test processor is configured to obtain an entry of the dictionary memory structure in response to a second instruction in the sequence of instructions, wherein the entry represents the first subsequence of test vectors stored in the dictionary memory structure; wherein the test processor is configured to obtain an entry of the dictionary memory structure in response to a third instruction in the sequence of instructions, wherein the entry represents the first subsequence of test vectors stored in the dictionary memory structure, and wherein the third instruction defines the provision of a true subset of the first subsequence of test vectors; wherein the first instruction and the second instruction reference to the same entry of the dictionary memory structure; wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors; and wherein the test processor is configured to provide the device under test signal based on the subsequence of test vectors.

According to another embodiment, a test system may have: the inventive test processor; and a memory including the dictionary memory structure.

According to another embodiment, a method for providing a sequence of instructions based on a representation of a sequence of test vectors, each instruction defining the provision of at least one test vector to a device under test, may have the steps of: identifying in the representation of the sequence of test vectors subsequences of test vectors which occur at least two times in the representation of the sequence of test vectors; storing the identified subsequences of test vectors in a dictionary memory structure; and providing the sequence of instructions such that the sequence of instructions includes at least a first instruction defining a first provision of a first subsequence of test vectors stored in the dictionary memory structure and a second instruction defining a second provision of the first subsequence of test vectors; wherein the first instruction and the second instruction reference to a same entry of the dictionary memory structure; wherein the sequence of instructions is provided such that the sequence of instructions includes a third instruction defining the provision of a true subset of the first subsequence of test vectors; and wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors.

According to another embodiment, a method for providing a device under test signal for a device under test based on a sequence of instructions may have the steps of: obtaining an entry of a dictionary memory structure in response to a first instruction in the sequence of instructions, wherein the entry represents a first subsequence of test vectors stored in the dictionary memory structure; obtaining an entry of the dictionary memory structure in response to a second instruction in the sequence of instructions, wherein the entry represents the first subsequence of test vectors stored in the dictionary memory structure; obtaining an entry of the dictionary memory structure in response to a third instruction in the sequence of instructions, wherein the entry represents the first subsequence of test vectors stored in the dictionary memory structure, and wherein the third instruction defines the provision of a true subset of the first subsequence of test vectors; wherein the first instruction and the second instruction reference to the same entry of the dictionary memory structure; wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors; and providing the device under test signal based on the subsequence of test vectors.

Another embodiment may have a non-transitory digital storage medium having a computer program stored thereon to perform the method for providing a sequence of instructions based on a representation of a sequence of test vectors, each instruction defining the provision of at least one test vector to a device under test, the method having the steps of: identifying in the representation of the sequence of test vectors subsequences of test vectors which occur at least two times in the representation of the sequence of test vectors; storing the identified subsequences of test vectors in a dictionary memory structure; and providing the sequence of instructions such that the sequence of instructions includes at least a first instruction defining a first provision of a first subsequence of test vectors stored in the dictionary memory structure and a second instruction defining a second provision of the first subsequence of test vectors; wherein the first instruction and the second instruction reference to a same entry of the dictionary memory structure; wherein the sequence of instructions is provided such that the sequence of instructions includes a third instruction defining the provision of a true subset of the first subsequence of test vectors; and wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors, wherein said computer program is run by a computer.

Another embodiment may have a non-transitory digital storage medium having a computer program stored thereon to perform the method for providing a device under test signal for a device under test based on a sequence of instructions, the method having the steps of: obtaining an entry of a dictionary memory structure in response to a first instruction in the sequence of instructions, wherein the entry represents a first subsequence of test vectors stored in the dictionary memory structure; obtaining an entry of the dictionary memory structure in response to a second instruction in the sequence of instructions, wherein the entry represents the first subsequence of test vectors stored in the dictionary memory structure; obtaining an entry of the dictionary memory structure in response to a third instruction in the sequence of instructions, wherein the entry represents the first subsequence of test vectors stored in the dictionary memory structure, and wherein the third instruction defines the provision of a true subset of the first subsequence of test vectors; wherein the first instruction and the second instruction reference to the same entry of the dictionary memory structure; wherein the third instruction contains an index value defining the first subsequence of test vectors stored in the dictionary memory structure to which the third instruction references, an offset value defining a first test vector of the true subset of test vectors in the first subsequence of test vectors and a length value or end value defining the last test vector of the true subset of test vectors in the first subsequence of test vectors; and providing the device under test signal based on the subsequence of test vectors, wherein said computer program is run by a computer.

Embodiments of the present invention provide an instruction provider for providing a sequence of instructions based on a representation of a sequence of test vectors. Each instruction defines the provision of at least one test vector to a device under test. The instruction provider is configured to identify in the representation of the sequence of test vectors subsequences of test vectors which occur at least two times in the sequence of test vectors. Furthermore, the instruction provider is configured to store the identified subsequences in a dictionary memory structure. Furthermore, the instruction provider is configured to provide the sequence of instructions such that the sequence of instructions includes at least a first instruction defining a first provision of a first subsequence of test vectors stored in the dictionary memory structure and such that the sequence of instructions includes a second instruction defining a second provision of the first subsequence. The first instruction and the second instruction reference to the same (first) entry of the dictionary memory structure.

It has been found by the inventors that an improved concept for providing a sequence of instructions can be provided, when a representation of a sequence of test vectors based on which a sequence of instructions is provided is scanned for subsequences which occur more than twice (which occur repeatedly) without the need for having these subsequences occurring subsequently. The subsequences which occur more than twice can be stored in a dictionary memory structure so that in the sequence of instructions different instructions can reference to the same entry of the dictionary memory structure to provide the subsequence of test vectors to the device under test. Hence, it has been found by the inventors that in some cases (such as PRBS— Pseudorandom Bit Sequence) the data has no consecutive repeating sequence but subsequences of data (the subsequences of test vectors), which are randomly distributed (and repeated) throughout the pattern. To now achieve a more efficient compression algorithm those subsequences in a pattern (in the sequence of test vectors) are identified and a hybrid algorithm, which consists of a method RLE (Run Length Encoding) and a dictionary based encoding (like Lempel-Ziv) is used to compress the data. The instruction provider (e.g. implemented in software) arranges the vector data in a tester memory in a special layout (in the dictionary memory structure) and creates a suitable test processor (sequencer) program (the sequence of instructions) to decompress the data on the fly.

Accordingly, embodiments of the present invention provide a test processor which is capable of handling the sequence of instructions as provided by the instruction provider. Hence, embodiments of the present invention provide a test processor for providing a device under test signal for a device under test based on a sequence of instructions (such as a sequence of instructions provided by the instruction provider). The test processor is configured to obtain an entry of a dictionary memory structure, in response to a current instruction in the sequence of instructions. The entry represents a subsequence of test vectors (which could be identified and stored by the instruction provider into the dictionary memory structure). The test processor is further configured to provide the device under test signal based on the subsequence of test vectors.

Hence, the test processor according to embodiments of the present invention is configured to access the dictionary memory structure created by the instruction provider to obtain an entry which contains a subsequence of test vectors identified and stored by the instruction provider. Hence, several different instructions (in the sequence of instructions) which may occur subsequently in the sequence of instructions (but with further instructions in between) can reference to the same entry in this dictionary memory structure and therefore to the same subsequence of test vectors to be provided in the device under test signal. By having the special instructions and furthermore the dictionary memory structure it can be achieved that not for every occurrence of the subsequence of test vectors in the sequence of test vectors the complete subsequence has to be copied into the memory of the test processor or of a test system, as it is now sufficient to provide this subsequence of test vectors only one time (in the dictionary memory structure) and to provide corresponding instructions, which instruct the test processor to access the dictionary memory structure to obtain the subsequences of test vectors from the dictionary memory structure.

Hence, embodiments of the present invention provide dedicated test processor instructions to create an optimized memory layout and to efficiently decompress the data. To summarize, the vector data of the pattern (the test vectors of the representation of the sequence of test vectors) is laid out as an indexed dictionary (array) and the sequencer program (such as the instruction provider) configures the test processor to consider the memory region as such an indexed dictionary (as a dictionary memory structure). Later instruction can use an index to retrieve the data (the subsequence of test vectors) from the dictionary for the vector generation.

According to further embodiments of the present invention the instruction provider can be configured to provide the sequence of instructions such that the sequence of instructions comprises a third instruction defining the provision of a true subset of the first subsequence of test vectors.

Hence, it has also been found by the inventors that it is neither practical nor possible to find the most optimal compression considering other constraints like compression performance, memory bandwidth and throughput. Therefore, sometimes there are small subsequences that are contained in larger subsequences which cannot/should not be broken down to smaller pieces considering throughput. The instruction provider of embodiments of the present invention can find the smaller sequences and only keep the larger sequence in the dictionary memory structure. The smaller one can then be retrieved from the larger one to obtain a higher compression. In other words, an instruction does not necessarily define the complete provision of the complete subsequence of test vectors, but can also define the provision of only a true subset of a subsequence of test vectors stored in the dictionary memory structure.

As an example, such an instruction can comprise an offset which defines a first test vector of the true subset and a length which defines the length and the last test vector of the true subset of test vectors.

Accordingly, the test processor can be configured to, in response to a further instruction (such as the mentioned third instruction) obtain a true subset of a subsequence of test vectors (such as the first subsequence of test vectors) stored in the dictionary memory structure. Furthermore, the test processor is configured to provide the device under test signal based on this true subset of the (first) subsequence of test vectors.

Hence, embodiment of the present invention achieve the eliminating of the storing of smaller subsequences of test vectors which are part of larger subsequences of test vectors which are already stored inside the dictionary memory structure.

With the concept of the present invention one can achieve a maximum throughput with a heavy compression.

Further embodiments of the present invention provide a method for providing a sequence of instructions based on a representation of a sequence of test vectors.

Further embodiments of the present invention provide a method for providing a device under test signal for a device under test based on a sequence of instructions.

BRIEF DESCRIPTION OF THE DRAWINGS

Embodiments of the present invention will be detailed subsequently referring to the appended drawings, in which:

FIGS. 4A-4B shows an example of how smaller subsequences which are part of larger subsequences of test vectors can be eliminated;

FIGS. 7A-7D shows an example of how a conventional run length encoding algorithm works.

DETAILED DESCRIPTION OF THE INVENTION

Before embodiments of the present invention are described in more detail it is to be pointed out that in the figures the same elements or functionally equal elements are provided with the same reference numbers. Hence, descriptions provided for elements having the same reference numbers are mutually exchangeable.

Figure 1:
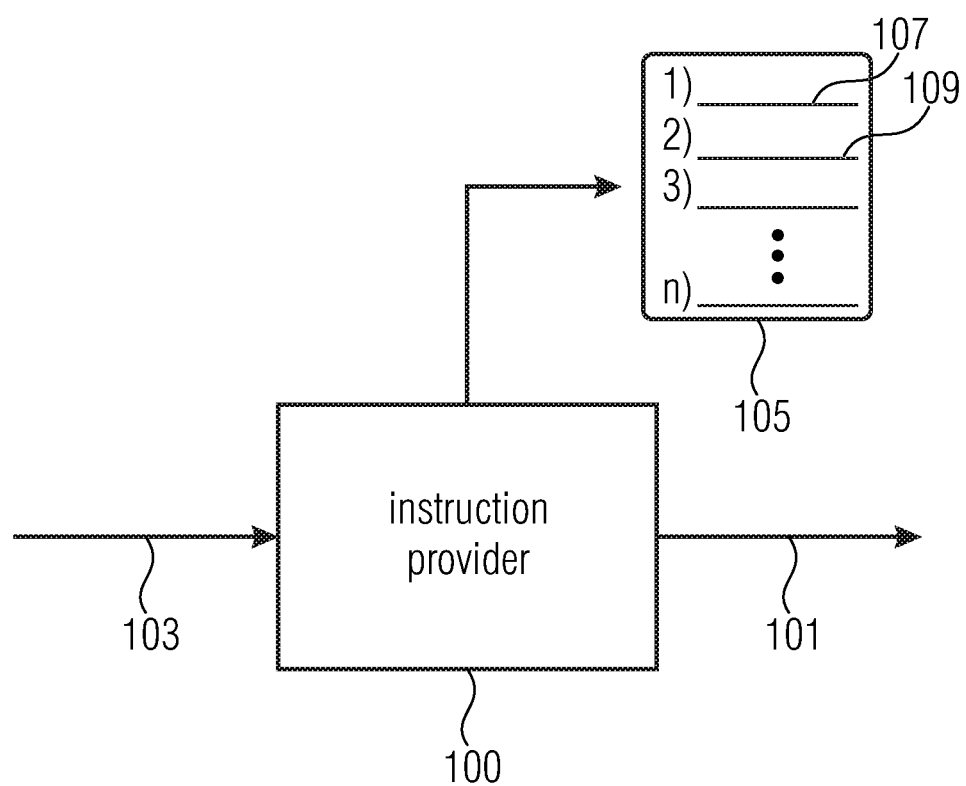
FIG. 1 shows a block schematic diagram of an instruction provider according to an embodiment of the present invention.

FIG. 1 shows a block schematic diagram of an instruction provider 100 according to an embodiment of the present invention. The instruction provider 100 is configured to provide a sequence 101 of instructions based on a representation 103 of a sequence of test vectors. Each instruction in the sequence of instructions 101 defines a provision of at least one test vector (of the representation 103 of the sequence of test vectors) to a device under test. The instruction provider 100 is configured to identify in the representation 103 of the sequence of test vectors subsequences of test vectors which occur at least two times in the representation 103 of the sequence of test vectors. Furthermore, the instruction provider 100 is configured to store the identified subsequence of test vectors in a dictionary memory structure 105. Furthermore, the instruction provider 100 is configured to provide the sequence of instructions such that the sequence of instructions comprises at least a first instruction defining a first provision of a first subsequence 107 of test vectors stored in the dictionary memory structure 105 and a second instruction defining a second provision of the first subsequence 107 of test vectors. Furthermore, the first instruction and the second instruction reference to the same (e.g. first) entry of the dictionary memory structure 105.

The representation 103 of the sequence of test vectors can be, for example, a simple stream of test vectors. According to further embodiments the representation 103 of the sequence of test vectors could also be a part of a program code having loop instructions (which define the looping of certain subsequences of test vectors). Such subsequences of test vectors can be found by the instructions provider 100 in the representation 103 and are stored into the dictionary memory structure 105 as different entries.

The dictionary memory structure 105 can be, for example, a dedicated area in a program code generated together with the sequence 101 of instructions. This dictionary memory structure 105 generates a dictionary in a memory onto which a test processor (such as a test processor 200 shown in FIG. 2) can access, to obtain the different subsequences of test vectors stored in the dictionary memory structure 105. As an example, when a compiled binary which comprises the sequence 101 of instructions and furthermore the subsequences of test vectors is loaded onto a test processor 200, the test processor 200 generates in its associated memory a dictionary comprising the subsequence of test vectors based on the dictionary memory structure 105.

An example of such a dictionary memory structure 105 is given in FIG. 3B and will be explained later on.

Furthermore, the first entry of the dictionary memory structure 105 contains the first subsequence 107 of test vectors. In the example shown in FIG. 3B the first entry of the dictionary memory structure comprises the first subsequence 107 of test vectors, which in this case is the sequence of eight test vectors (00 F1 F3 E1 05 90 55 AA).

Furthermore, each of the test vectors in such a subsequence of test vectors defines the provision of a plurality of signal transitions and/or signal states in a device under test signal which is to be provided to the device under test. Hence, a signal wave which is provided to the device under test is typically based on the signal transitions or signal states defined in the sequence of test vectors.

Furthermore, the instruction provider 100 can be configured to further store a plurality of subsequences of test vectors in the dictionary memory structure 105. Lengths of these different subsequences of test vectors stored in the dictionary memory structure 105 can vary. Hence, the instruction provider 100 can be configured to store a second subsequence 109 of test vectors in the dictionary memory structure 105, wherein a length of the first subsequence 107 is different from a length of the second subsequence 109. Referring again to the example of FIG. 3B it can be seen that the first subsequence 107 has (in this example) a length of 8 while the second subsequence 109 of test vectors has (in this example) a length of 6 test vectors. Hence, the length of the subsequences of test vectors stored in the dictionary memory structure 105 is not fix and typically depends on the representation 103 of the sequence of test vectors and on the length of the subsequences of test vectors in the representation 103 of test vectors which occur more than twice (which occur repeatedly).

As already described above, the representation 103 of test vectors can be a stream of test vectors. The instruction provider 100 is configured to receive this stream of test vectors and to provide the sequence 101 of instructions based on this received stream of test vectors.

Such a stream of test vectors could be for example the one shown in FIG. 7A or the one shown in FIG. 7C in which A, B and C are each a block of test vectors.

Figure 2:
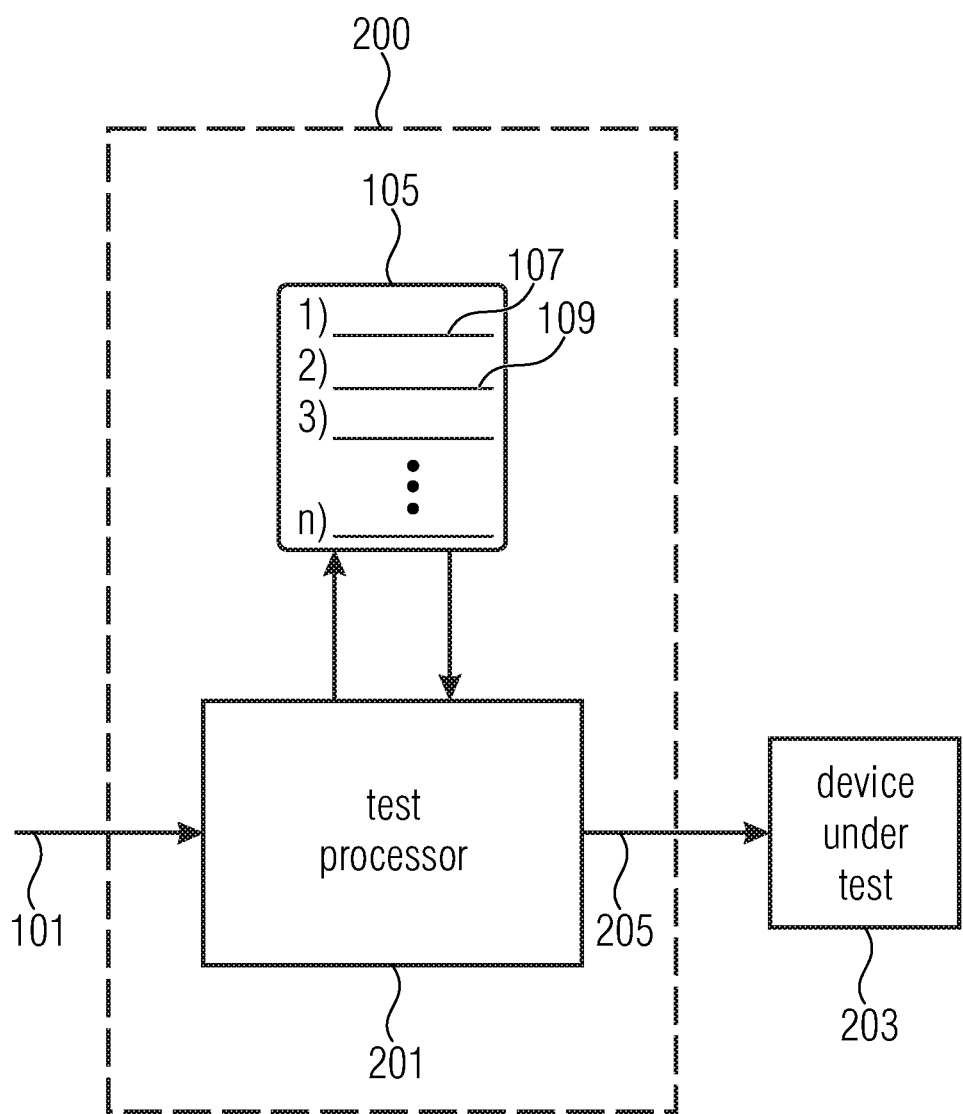
FIG. 2 shows a block schematic diagram of a test processor according to an embodiment of the present invention.

FIG. 2 shows a block schematic diagram of a test system 200 according to an embodiment of the present invention. The test system 200 comprises a test processor 201 according to an embodiment of the present invention and a dictionary memory structure 105. The dictionary memory structure 105 could be a region in a memory of the test system 200 which could be even a memory of the test processor 201 itself. Such a memory could be, for example a volatile working memory of the test system 200. Furthermore, FIG. 2 shows a device under test 203, the device under test 203 is configured to receive a device under test signal 205 from the test processor 201. The test processor 201 is configured to provide the device under test signal 205 for the device under test 203 based on a sequence of instructions. The sequence of instructions is typically provided by the instruction provider 100 and therefore the sequence of instructions shown in FIG. 2 is also given the reference sign 101. The test processor 201 is configured to obtain an entry of the dictionary memory structure 105 in response to a current instruction in the sequence 101 of instructions. As already described, the entry represents a subsequence of test vectors (stored in the dictionary memory structure 105). Furthermore, the test processor 201 is configured to provide the device under test signal 205 based on the subsequence of test vectors obtained from the dictionary memory structure 105 in dependence on the current instruction.

In other words, the test processor 201 obtains the subsequence of test vectors from the dictionary memory structure 105, wherein each test vector corresponds to a certain number of signal transitions or signal states of the device under test signal 205. Hence, the test processor 201 applies these signal states or signal transitions defined in the test vectors in the subsequence of test vectors to the device under test 203 by means of the device under test signal 205.

The dictionary memory structure 105 can be created in the memory of the test system 200, for example using dedicated test processor instructions which are provided by the instruction provider 100 inside the sequence 101 of instructions to create an optimized memory layout in the test system 200.

In the following, two examples are given to explain the present invention in more detail. Furthermore, further advantageous modifications of the test processor 201 and the instruction provider 100 will be described.

Figures 3A, 3B, 3C:
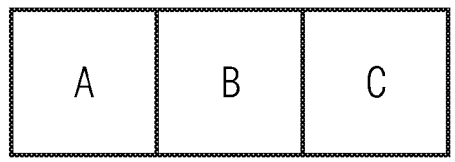
FIGS. 3A-3C shows a first example of how the instruction provider shown in FIG. 1 performs the compression of a sequence of test vectors into a sequence of instructions.

Starting from the sequence of test vectors shown in FIG. 7C, with the new memory layout and the new test processor instructions described in this present application, a compression of the data to the stream shown in FIG. 3A can be achieved. Hence, a compression factor of 6 can be achieved.

As already described the vector data of the pattern is laid out as an indexed dictionary (array) such as the dictionary memory structure 105 as shown in FIG. 3B. The sequencer or the test processor 201 is configured to consider the memory region in which the dictionary memory structure 105 is placed as such an indexed dictionary. Later instructions (the instructions in the sequence 101 of instructions) can use an index to retrieve the data (the several subsequences of test vectors) from the dictionary memory structure 105 for the vector generation (for the generation of the device under test signal 205).

As an example, the sequence of test vectors shown in FIG. 7C could create a dictionary memory structure 105 as shown in FIG. 3B. The exemplary dictionary memory structure 105 shown in FIG. 3B only has three entries, each of which defines the provision of a certain subsequence of test vectors in the device under test signal 205.

FIG. 3C shows an example for a sequencer program for providing the first entry (the first subsequence 107 of test vectors) and the second entry (the second subsequence 109 of test vectors).

In the example shown in FIG. 3C, it can be seen that an instruction can further include a number of times a certain subsequence of test vectors is to be repeated subsequently. In the example shown in FIG. 3C the second subsequence 109 of test vectors (also designated as B) is generated twice.

As already described, each vector in a subsequence of test vectors defines a set of signal transition or signal states of the device under test signal 205.

Furthermore, it has been found by the inventors that is neither practical nor possible to find the most optimal compression when considering constraints like compression performance, memory bandwidth and throughput. Therefore, there are sometimes small subsequences of test vectors that are contained in larger subsequences of test vectors which cannot or should not be broken down to smaller pieces when considering throughput.

The instruction provider 100 can find such smaller subsequences and only keep the larger entry (the larger subsequences of test vectors containing the smaller subsequences of test vectors). The smaller subsequence of test vectors can then be obtained from the larger one to obtain a higher compression.

FIG. 4A shows a dictionary memory structure 105 which is further compressed by eliminating the entry C altogether as it is already contained in the entry A. In other words, the instruction provider 100 is configured to, if it finds a subsequence of test vectors which is already contained in another (larger) subsequence of test vectors to not separately store the smaller subsequence of test vectors in the dictionary memory structure 105. To give the test processor 200 the possibility to obtain such smaller subsequences of test vectors a special instruction can be provided in the sequence 101 of instructions which can contain a value defining the entry in the dictionary memory structure 105 to be obtained and furthermore an offset and a length for the smaller subsequence of test vectors.

Such an example is shown in FIG. 4B in which in the second instruction the smaller subsequence of test vectors C which is completely included in the larger subsequence of test vectors A is obtained. As can be seen, these instructions for obtaining the subsequence of test vectors C comprises an offset value defining the first test vector of the smaller subsequence of test vectors inside the larger subsequence of test vectors and furthermore a length value defining the length of the smaller subsequence of test vectors inside the larger subsequence of test vectors.

Hence, the sequence 101 of instructions can comprise an instruction which contains an index value defining a certain subsequence of test vectors stored in the dictionary memory 105 to which this instruction references. Furthermore, this instruction can comprise an offset values defining a first test vector of a true subset of test vectors (the subsequence C) in a certain subsequence of test vectors (the larger subsequence A). Furthermore, such instruction comprises a length and/or end value defining the last test vector of the true subset (the smaller subsequence C) in the certain subsequence of test vectors (the larger subsequence A).

Furthermore, as can be seen from FIG. 4A, the instruction provider 100 is configured to compare an identified subsequence of test vectors in the representation 103 of test vectors with the subsequences of test vectors already stored in the dictionary memory structure 105. If an identified subsequence is a true subset of an already stored subsequence (such as the subsequence C being a true subset of the subsequence A) the instruction provider 100 is configured to omit storing the identified subsequence. Instead, the instruction provider 100 provides in the sequence 101 of instructions an instruction defining a provision of the identified subset of test vectors as a true subset of the already stored subsequence.

This is done, for example, by providing the instruction as shown in FIG. 4B containing on the one hand an index value defining the entry in the dictionary memory structure 105 and on the other hand an offset value and a length or end value defining the true subset of test vectors of the subsequence of test vectors stored in the dictionary memory structure 105 at the index value in the instruction.

Furthermore, the instruction provider 100 is further configured to, if an already stored subsequence in the dictionary memory structure 105 is a true subset of a newly identified subsequence, remove the already stored subset from the dictionary memory structure 105, store the newly identified subsequence in the dictionary memory structure 105 and to replace the instructions in the sequence 101 of instructions referencing to the already stored subset of test vectors in the dictionary memory structure 105 with instructions referencing to the newly identified subsequence of test vectors in the dictionary memory structure 105 and which further define the provision of the already stored subsequence of test vectors (which has been deleted in the dictionary memory structure 105) as a true subset of the newly identified subsequence of test vectors.

In other words, when the instruction provider 100 identifies in the representation 103 of the sequence of test vectors a subsequence of test vectors which is a larger subsequence of test vectors than an already stored subsequence of test vectors but which completely contains the already stored subsequence of test vectors, the already stored subsequence of test vectors can be replaced with the newly identified subsequence of test vectors. Instructions in the sequence 101 of instructions, which reference to the smaller subsequence of test vectors are then replaced with instructions which reference to the newly identified (larger) subsequence of instructions and which furthermore define a provision of the smaller subset of instructions as a true subset of the larger subsequence of instructions.

By having this mechanism an optimized compression can be achieved.

Embodiments of the present invention can be implemented in hardware or software and achieve a very good compression for large patterns of various types.

Figure 5:
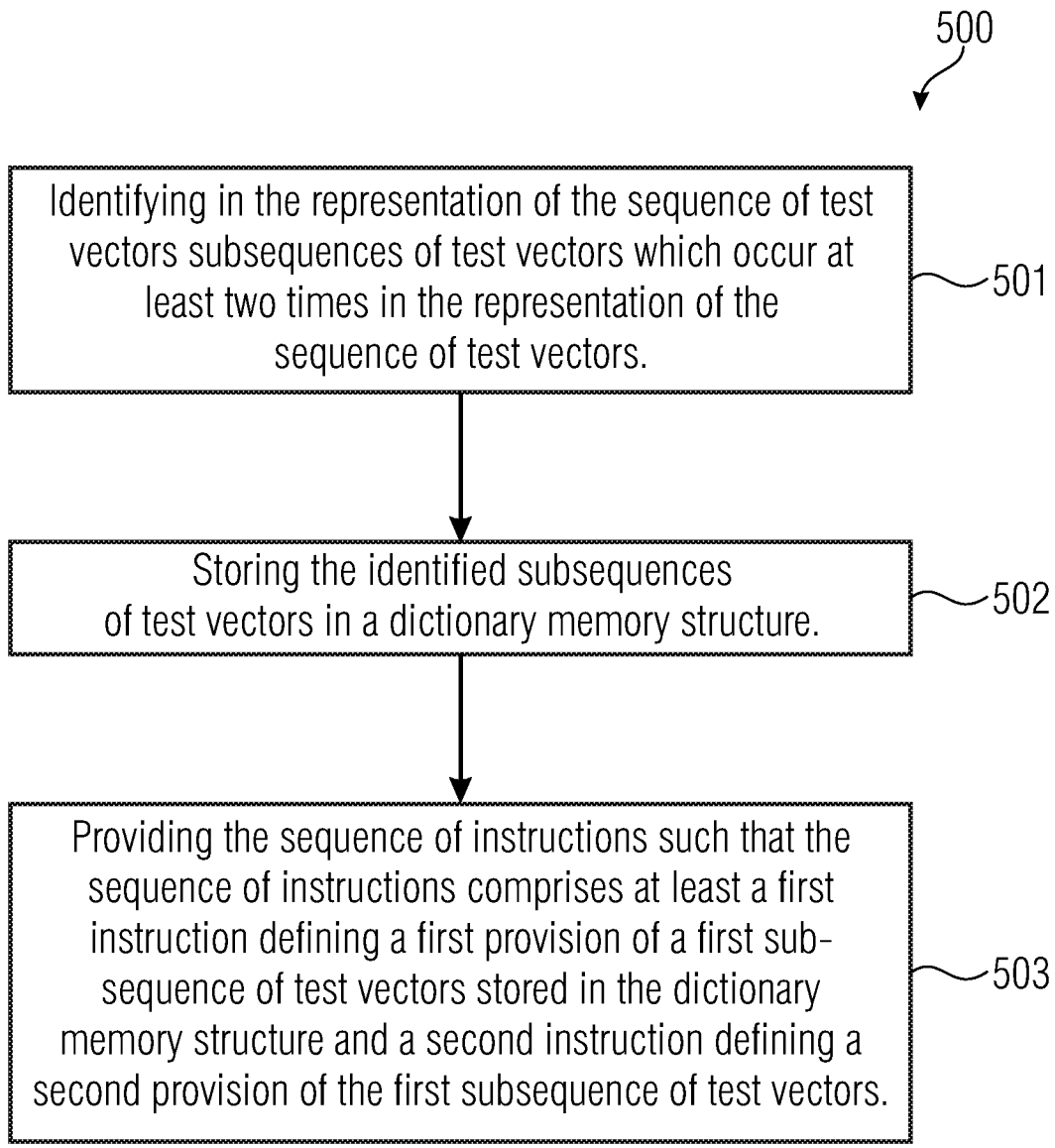
FIG. 5 shows a flowchart of a method for providing a sequence of instructions based on a representation of a sequence of test vectors according to an embodiment of the present invention.

FIG. 5 shows a flowchart of a method 500 according to an embodiment of the present invention.

The method 500 can be performed, for example, using the instruction provider 100.

The method 500 for providing a sequence of instructions based on a representation of a sequence of test vectors, each instruction defining the provision of at least one test vector to device under test comprises a step 501 of identifying in the representation of the sequence of test vectors subsequences of test vectors which occur at least two times in the representation of the sequence of test vectors.

Furthermore, the method 500 comprises a step 502 of storing the identified subsequences of test vectors in a dictionary memory structure.

Furthermore, the method 500 comprises a step 503 of providing the sequence of instructions such that the sequence of instructions comprises at least a first instruction defining a first provision of a first subsequence of test vectors stored in the dictionary memory structure and a second instruction defining a second provision of the first subsequence. The first instruction and the second instruction reference to the same entry of the dictionary memory structure.

Figure 6:
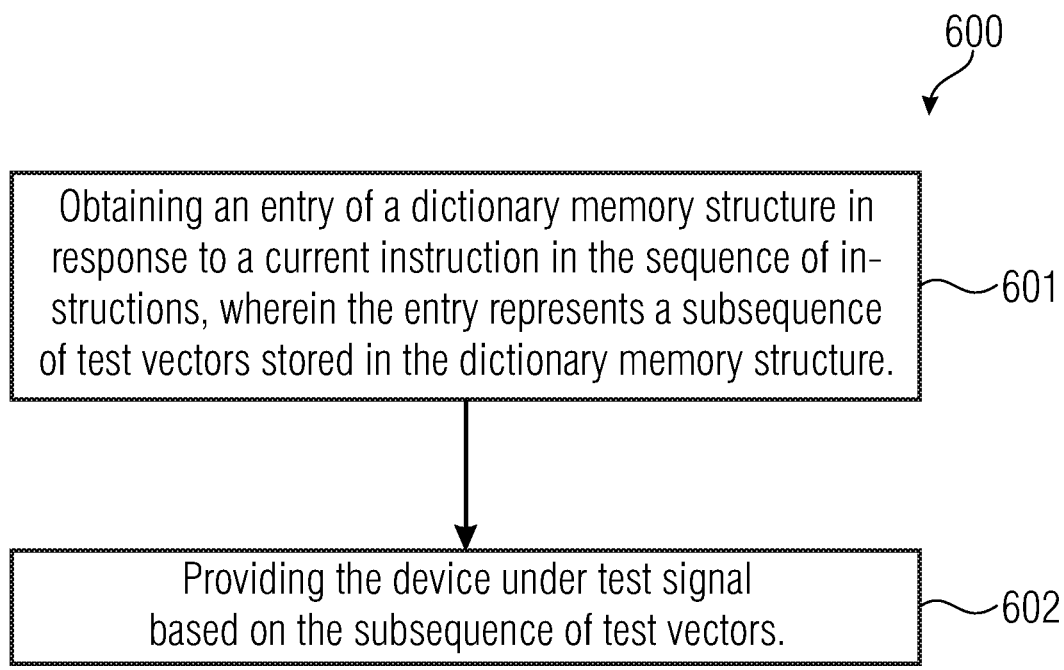
FIG. 6 shows a flowchart of a method for providing a device under test signal for a device under test based on a sequence of instructions.

Furthermore, FIG. 6 shows a flowchart of a method 600 for providing a device under test signal for a device under test based on a sequence of instructions according to an embodiment of the present invention.

The method 600 can be performed, for example, using the test processor 200.

The method 600 comprises a step 601 of obtaining an entry of a dictionary memory structure in response to a current instruction in the sequence of instructions. The entry represents a subsequence of test vectors stored in the dictionary memory structure.

Furthermore, the method 600 comprises a step 602 of providing the device under test signal based on the subsequence of test vectors.

The methods 500 and 600 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus comprising:
   an instruction provider configured to provide a sequence of instructions based on a representation of a sequence of test vectors, each instruction defining provision of at least one test vector to a device under test;

wherein the instruction provider is configured to identify in the representation of the sequence of test vectors subsequences of test vectors which occur at least two times in the representation of the sequence of test vectors, to store the identified subsequences of test vectors in a dictionary memory structure as indexed entries, and to provide the sequence of instructions comprising a first instruction defining a first provision of a first subsequence of test vectors stored in the dictionary memory structure, and a second instruction defining a second provision of the first subsequence of test vectors; and wherein the first instruction and the second instruction reference a same indexed entry of the dictionary memory structure;

wherein the instruction provider is configured to provide the sequence of instructions further comprising a third instruction defining a third provision of a true subset of the first subsequence of test vectors; and wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors.

2. The apparatus according to claim 1, wherein a first entry comprises the first subsequence of test vectors.

3. The apparatus according to claim 1, wherein each test vector defines provision of a plurality of signal states and/or signal transitions in a device under test signal which is to be provided to the device under test.

4. The apparatus according to claim 1, wherein the instruction provider is configured to further store a second subsequence of test vectors in the dictionary memory structure, wherein a length of the first subsequence of test vectors is different from a length of the second subsequence of test vectors.

5. The apparatus according to claim 1, wherein the instruction provider is configured to compare a newly identified subsequence of test vectors with subsequences of test vectors already stored in the dictionary memory structure; and wherein the instruction provider is configured to, if the newly identified subsequence of test vectors is a true subset of an already stored subsequence of test vectors, omit storing the newly identified subsequence of test vectors and provide in the sequence of instructions an instruction defining a provision of the newly identified subsequence of test vectors as a true subset of the already stored subsequence of test vectors.

6. The apparatus according to claim 1, wherein the instruction provider is configured to compare a newly identified subsequence of test vectors with the subsequences of test vectors already stored in the dictionary memory structure; and wherein the instruction provider is configured to, if an already stored subsequence of test vectors is a true subset of a newly identified subsequence of test vectors, remove the already stored subsequence of test vectors from the dictionary memory structure, store the newly identified subsequence of test vectors in the dictionary memory structure, and replace instructions in the sequence of instructions referencing to the removed subsequence of test vectors in the dictionary memory structure with instructions referencing to the newly identified subsequence of test vectors in the dictionary memory structure and defining the provision of the removed subsequence of test vectors as a true subset of the newly identified subsequence of test vectors.

7. The apparatus according to claim 1, wherein the representation of the sequence of test vectors is a stream of test vectors; and wherein the instruction provider is configured to receive the stream of test vectors and to provide based on the stream of test vectors the sequence of instructions.

8. An apparatus comprising:

a test processor configured to provide a device under test signal for a device under test based on a sequence of instructions;

wherein the test processor is configured to acquire an entry of a dictionary memory structure in response to a first instruction in the sequence of instructions, wherein the entry represents a first subsequence of test vectors stored in the dictionary memory structure;

wherein the test processor is configured to acquire another entry of the dictionary memory structure in response to a second instruction in the sequence of instructions, wherein the another entry represents the first subsequence of test vectors stored in the dictionary memory structure;

wherein the test processor is configured to acquire an additional entry of the dictionary memory structure in response to a third instruction in the sequence of instructions, wherein the additional entry represents the first subsequence of test vectors stored in the dictionary memory structure, and wherein the third instruction defines a provision of a true subset of the first subsequence of test vectors;

wherein the first instruction and the second instruction reference a same entry of the dictionary memory structure;

wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors; and wherein the test processor is configured to provide the device under test signal based on subsequences of test vectors from the entry, the another entry, and the additional entry.

9. The apparatus according to claim 8, wherein the test processor is configured to choose the true subset of test vectors out of the subsequence of test vectors in dependence on a current instruction; and wherein the test processor is further configured to provide the device under test signal based on the chosen true subset.

10. The apparatus according to claim 8, wherein each test vector defines a set of signal states and/or signal transitions of the device under test signal.

11. The apparatus according to claim 8, further comprising:
a memory comprising the dictionary memory structure.

12. A method for providing a sequence of instructions based on a representation of a sequence of test vectors, each instruction defining provision of at least one test vector to a device under test, the method comprising:
identifying in the representation of the sequence of test vectors subsequences of test vectors which occur at least two times in the representation of the sequence of test vectors;
storing the identified subsequences of test vectors in a dictionary memory structure as indexed entries; and
providing the sequence of instructions comprising a first instruction defining a first provision of a first subsequence of test vectors stored in the dictionary memory structure and a second instruction defining a second provision of the first subsequence of test vectors;
wherein the first instruction and the second instruction reference a same indexed entry of the dictionary memory structure;
wherein the sequence of instructions further comprises a third instruction defining a third provision of a true subset of the first subsequence of test vectors; and
wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors.

13. A method for providing a device under test signal for a device under test based on a sequence of instructions, the method comprising:
acquiring an entry of a dictionary memory structure in response to a first instruction in the sequence of instructions, wherein the entry represents a first subsequence of test vectors stored in the dictionary memory structure;
acquiring another entry of the dictionary memory structure in response to a second instruction in the sequence of instructions, wherein the another entry represents the first subsequence of test vectors stored in the dictionary memory structure;
acquiring an additional entry of the dictionary memory structure in response to a third instruction in the sequence of instructions, wherein the additional entry represents the first subsequence of test vectors stored in the dictionary memory structure, and wherein the third instruction defines a provision of a true subset of the first subsequence of test vectors;
wherein the first instruction and the second instruction reference a same entry of the dictionary memory structure;
wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors; and
providing the device under test signal based on subsequences of test vectors from the entry, the another entry, and the additional entry.

14. A non-transitory digital storage medium having a computer program stored thereon to perform a method for providing a sequence of instructions based on a representation of a sequence of test vectors, each instruction defining provision of at least one test vector to a device under test, the method comprising:
identifying in the representation of the sequence of test vectors subsequences of test vectors which occur at least two times in the representation of the sequence of test vectors;
storing the identified subsequences of test vectors in a dictionary memory structure as indexed entries; and
providing the sequence of instructions comprising a first instruction defining a first provision of a first subsequence of test vectors stored in the dictionary memory structure and a second instruction defining a second provision of the first subsequence of test vectors;
wherein the first instruction and the second instruction reference a same indexed entry of the dictionary memory structure;
wherein the sequence of instructions further comprises a third instruction defining a third provision of a true subset of the first subsequence of test vectors; and
wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors,
wherein said computer program is run by a computer.

15. A non-transitory digital storage medium having a computer program stored thereon to perform a method for providing a device under test signal for a device under test based on a sequence of instructions, the method comprising:
acquiring an entry of a dictionary memory structure in response to a first instruction in the sequence of instructions, wherein the entry represents a first subsequence of test vectors stored in the dictionary memory structure;
acquiring another entry of the dictionary memory structure in response to a second instruction in the sequence of instructions, wherein the another entry represents the first subsequence of test vectors stored in the dictionary memory structure;
acquiring an additional entry of the dictionary memory structure in response to a third instruction in the sequence of instructions, wherein the additional entry represents the first subsequence of test vectors stored in the dictionary memory structure, and wherein the third instruction defines a provision of a true subset of the first subsequence of test vectors;
wherein the first instruction and the second instruction reference to a same entry of the dictionary memory structure;
wherein the third instruction comprises an index value defining the first subsequence of test vectors stored in the dictionary memory structure to which the third instruction references, an offset value defining a first test vector of the true subset of test vectors in the first subsequence of test vectors, and a length value and/or an end value defining a last test vector of the true subset of test vectors in the first subsequence of test vectors; and providing the device under test signal based on subsequences of test vectors from the entry, the another entry, and the additional entry,
wherein said computer program is run by a computer.

* * * * *